US007936237B2

(12) United States Patent
Park et al.

(10) Patent No.: US 7,936,237 B2
(45) Date of Patent: May 3, 2011

(54) MULTI-BAND TRANSMIT-RECEIVE SWITCH FOR WIRELESS TRANSCEIVER

(75) Inventors: Seok-Bae Park, Dublin, OH (US); Partha Sarathy Murali, San Jose, CA (US)

(73) Assignee: Redpine Signals, Inc., San Jose, CA (US)

( * ) Notice: Subject to any disclaimer, the term of this patent is extended or adjusted under 35 U.S.C. 154(b) by 205 days.

(21) Appl. No.: 12/264,904

(22) Filed: Nov. 4, 2008

(65) Prior Publication Data

US 2010/0109796 A1 May 6, 2010

(51) Int. Cl.
*H01P 1/15* (2006.01)
*H03K 17/785* (2006.01)

(52) U.S. Cl. ........................................ 333/103; 333/101

(58) Field of Classification Search .................. 333/101, 333/103; 327/427, 430; 455/83
See application file for complete search history.

(56) References Cited

U.S. PATENT DOCUMENTS 5,777,530 A * 7/1998 Nakatuka ...................... 333/104
6,066,993 A * 5/2000 Yamamoto et al. ........... 333/103
6,882,829 B2 4/2005 Mostov et al.
7,236,044 B2 6/2007 Talwalkar et al.

FOREIGN PATENT DOCUMENTS

SG PCT/SG2006/000278 A1 3/2008

OTHER PUBLICATIONS

"Integrated CMOS Transmit-Receive Switch using LC-Tuned Substrate Bias for 2.4Ghz and 5.2Ghz Applications" IEEE Journal of Solid State Circuits, vol. 39, No. 6, Jun. 2004, p. 863-867.

"A Resonant Switch for LNA Protection in Watt-Level CMOS Transceivers", IEEE Transactions on Microwave Theory and Techniques, vol. 53, No. 9, Sep. 2005, p. 2819-2825.

"Design and Analysis for a Miniature CMOS SPDT Switch using Body-Floating Technique to Improve Power Performance", IEEE Transactions on Microwave Theory and Techniques, vol. 54, No. 1, Jan. 2006, p. 31-39.

* cited by examiner

*Primary Examiner* — Dean O Takaoka

(74) *Attorney, Agent, or Firm* — File-EE-Patents.com; Jay A. Chesavage

(57) ABSTRACT

A transmit-receive switch has a transmit port, an antenna port, and a receive port. A first switch couples the transmit port to the antenna port when a signal TxON is asserted. A LOW_BAND signal indicates the selection of a lower band of frequencies. A tuning structure is formed by a second and third switch in series which couple the antenna port to ground through a first capacitor when TxON and LOW_BAND are both asserted, and LOW_BAND may be provided to one or more such tuning structures for multi-band frequency operation. A second capacitor couples the antenna port to ground when a fourth switch is enabled. An inductor couples the antenna port to the receive port. A third capacitor is placed across the receive port and ground. A fifth switch is closed when TxON is asserted. The first through fifth switches can be a CMOS FET with an isolated substrate coupled to ground through an associated resistor.

18 Claims, 4 Drawing Sheets

Triple Well CMOS FET

MULTI-BAND TRANSMIT-RECEIVE SWITCH FOR WIRELESS TRANSCEIVER

FIELD OF THE INVENTION

The present invention relates to a transmit-receive switch for coupling a transmitter to an antenna port during one interval and the antenna port to a receiver during a different interval. In particular, the invention relates to a monolithic transmit-receive switch (TR Switch) which utilizes Complimentary Metal Oxide Semiconductor (CMOS) devices and related processes and includes the ability to operate in either a high band or low band frequency for optimized performance in either band of operation.

BACKGROUND OF THE INVENTION

FIG. 1 shows a prior art TR switch 102 coupled to a low noise amplifier 104, analog front end functions 106 which include a local oscillator and mixer for mixing a signal modulated by a carrier in a frequency range such as 4.9 Ghz to 5.9 Ghz down to baseband for digitizing prior to processing as a succession of digital samples by baseband processor 110. The baseband processor 110 also generates a baseband transmit symbol stream, which is handled by analog front end functions 108 which include conversion to an analog signal by a DAC, mixing to a fixed modulation frequency such as in the range 4.9 Ghz to 5.9 Ghz, amplification by power amplifier 112, and coupling to the transmit port of a TR switch 102 for coupling to antenna 100.

In the operation of a wireless transceiver, different time intervals are used for transmission and reception, and the function of the TR switch 102 during transmit intervals is to couple maximum power from the power amplifier 112 to the antenna 100 and to prevent level transmit signals from damaging the low noise amplifier 104 input. During receive intervals, the function of the TR switch is to maximize coupling of low level signals from the antenna 100 port to the LNA 104, as any loss in this receive path prior to the LNA represents an undesired increase in the noise figure of the system.

In prior art systems, PIN diodes or GaAs MESFETS are used to provide the TR switch function. Previous attempts to use CMOS FETs in the Ghz range have suffered from performance shortcomings of a reduced 1 dB input compression point compared to the desired goal of 30 dBm, and an insertion loss which is in excess of 1 dB. Additionally, it has not been possible to combine external elements in a CMOS FET for which a wide range of frequency operation is available.

It is desired to have a transmit-receive switch which uses CMOS FETs, has two or more ranges of operation, and provides both low insertion loss and an improved 1 dB compression point. Additionally, it is desired to provide a transmit-receive switch which may be fabricated in CMOS triple well technology, thereby providing a single integrated circuit which includes baseband processing, front end signal processing for transmit and receive paths, and low noise amplifiers and power amplifiers which are coupled directly to the transmit-receive switch.

OBJECTS OF THE INVENTION

A first object of the invention is a transmit-receive switch having a transmit port coupled to an antenna port through a first switch enabled by a TxON signal, the antenna port having a first capacitor coupled to the series combination of a second switch enabled by the TxON signal and a third switch enabled by a LOW_BAND signal, the antenna port also coupled to a second capacitor in series with a fourth switch enabled by the TxON signal, the antenna port also coupled through an inductor to a receive port, the receive port having a third capacitor coupled to ground and also a fifth switch coupled to ground and enabled by the TxON signal.

A second object of the invention is a transmit receive switch which has a first CMOS FET having a substrate coupled to ground through a first resistor, the first CMOS FET having a drain coupled to a transmit port and a source coupled to an antenna port, the antenna port coupled to a first capacitor coupled to the drain of a second CMOS FET, the second CMOS FET having a substrate coupled to ground through a second resistor, the second CMOS FET having a source coupled to the drain of a third CMOS FET, the third CMOS FET source coupled to ground and the third CMOS FET having a substrate coupled to ground through a third resistor, the antenna port also coupled to a second capacitor in series with the drain of a fourth CMOS FET, the source of the fourth CMOS FET coupled to ground and the substrate of the fourth CMOS FET coupled to ground through a fourth resistor, the antenna port also coupled to one end of an inductor with the other end coupled to a receive port, a third capacitor with one end coupled to the receive port and the other end coupled to ground, and a fifth CMOS FET having a drain coupled to the receive port, a grounded source, and a substrate coupled to ground through a fifth resistor, the first CMOS FET, second CMOS FET, fourth CMOS FET, and fifth CMOS FET having a gate coupled to a TxON signal which is asserted when the transmit port is active and not asserted at other times, the third CMOS FET having a gate coupled to LOW_BAND which is active when a lower frequency range is in use.

A third object of the invention is a transmit-receive switch having a transmit port coupled to an antenna port through a first switch enabled by a TxON signal, the antenna port having n switchable tuning structures and responsive to a particular LOW_BAND_n signal, each switchable tuning structure having a first capacitor coupled to the series combination of a second switch enabled by the TxON signal and a third switch enabled by a particular LOW_BAND_n signal, the antenna port also coupled to a second capacitor in series with a fourth switch enabled by the TxON signal, the antenna port also coupled through an inductor to a receive port, the receive port having a third capacitor coupled to ground and also a fifth switch coupled to ground and enabled by the TxON signal.

SUMMARY OF THE INVENTION

A transmit/receive switch has a plurality of elements including switches which may be CMOS FET switches having floating individual substrates. The switches may be arranged with an LC resonant circuit to provide high coupling from a transmit port to an antenna port and high isolation from transmit port to receive port during a transmit interval, and during a receive interval, a low insertion loss from an antenna port to a receiver port. In one embodiment of the invention, a transmit port is coupled to an antenna port through a first switch element, the antenna port coupled through one or more tuning structures, each tuning structure separately operable and having a first capacitor to a second switch element in series with an individually selectable third switch element from each tuning structure connected to ground, where the antenna port coupled through a second capacitor to ground through a fourth switch element, the antenna port coupled through an inductor to a receive port, the receive port coupled to ground through a third capacitor and also a parallel fifth switch element; the first switch element, each second switch element of each tuning structure, as well as the fourth, and fifth switch elements closed during a transmit time, and open during a receive time, the third switch element for a particular tuning structure closed for a low frequency mode and open for a high frequency mode, the one or more tuning structures providing one or more frequency bands of operation.

In another embodiment of the invention, a transmit/receive switch has a transmit port coupled to an antenna port through a first CMOS FET, the antenna port coupled through a first capacitor to ground through a second CMOS FET in series with a third CMOS FET, the antenna port coupled through a second capacitor to ground through a fourth CMOS FET, the antenna port coupled through an inductor to a receive port, the receive port coupled to ground through a third capacitor and also a parallel fifth CMOS FET; the first, second, fourth, and fifth CMOS FETS closed during a transmit time, and open during a receive time, the third CMOS FET closed for a low frequency mode and open for a high frequency mode, where each first, second, third, fourth, and fifth CMOS FET has an isolated substrate node coupled to ground through a resistor.

DETAILED DESCRIPTION OF THE INVENTION

Figure 1:
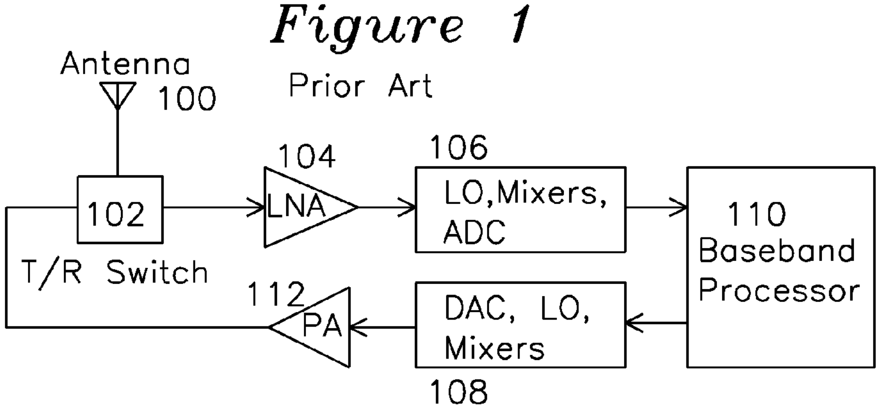
Figure 1 Prior Art
FIG. 1 shows the block diagram for a prior art transmit-receive (TR) switch.
Figure 2:
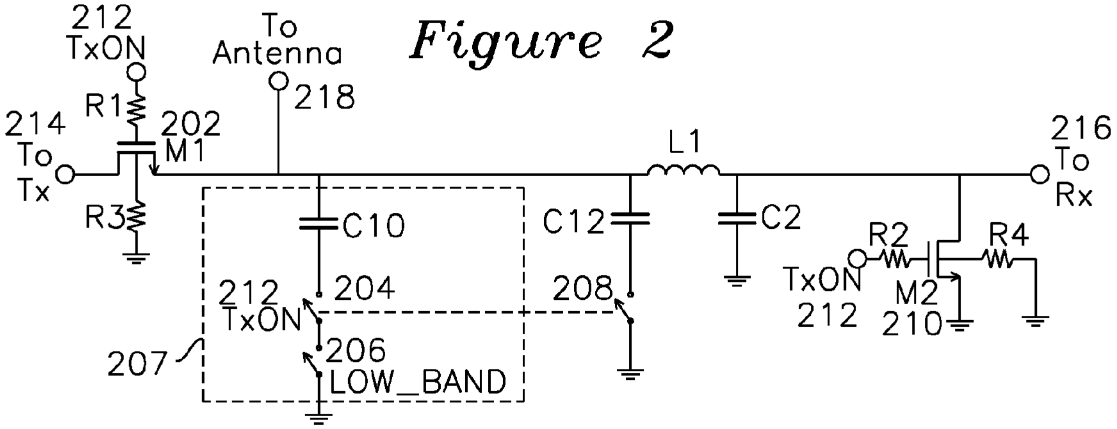
FIG. 2 shows a circuit diagram for an embodiment of a transmit-receive switch.
Figure 3:
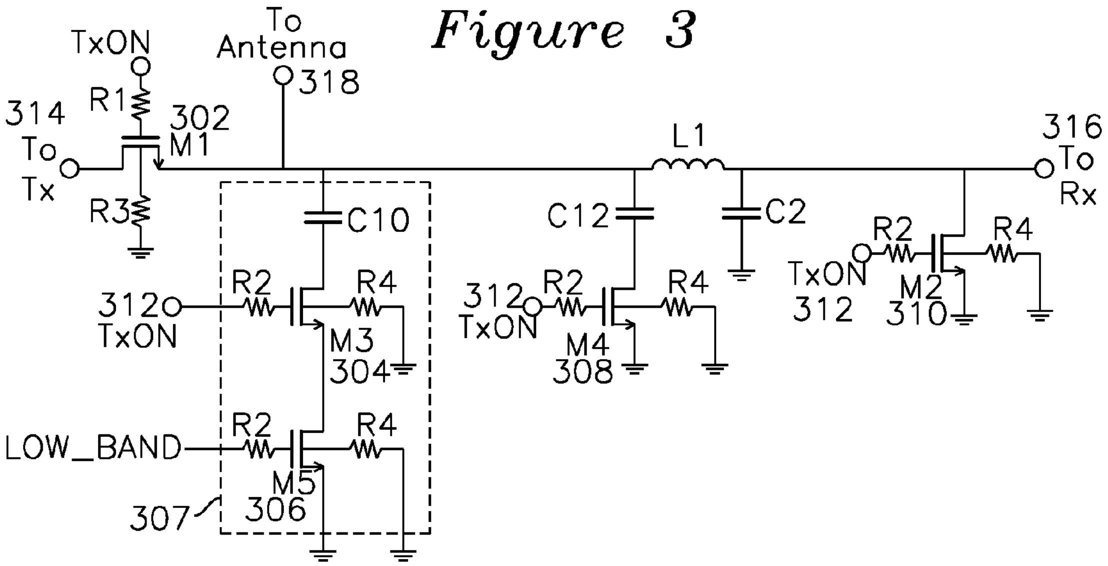
FIG. 3 shows a circuit diagram for an embodiment of a transmit-receive switch.

FIG. 2 shows one example embodiment of the invention using generalized switches, which may be any switch element, including a CMOS FET as shown in FIG. 3. In FIG. 2, a transmit port 214 such as coupled to a power amplifier 112 of FIG. 1 includes a first switch M1 202 which is responsive to TxON 212. When TxON is asserted, switch M1 is closed and transmit port 214 is coupled to antenna port 218. M1 202 as well as the other switch elements may be an isolated substrate CMOS FET, as known in the prior art, whereby a CMOS FET is fabricated over an isolated substrate (or bulk node), which may then be connected to resistor R3 which has a resistance low enough to provide a grounded reference for the bulk node, and has a resistance high enough such that it does not couple significant high frequency currents to ground, which would spoil the high frequency performance of the switch. A first capacitor C10 has one end coupled to antenna port 218, and the other end connected to ground by a series combination of a first switch 204 which is closed when TxON 212 is active, and a second switch 206 which is closed when a frequency band signal is asserted, shown as LOW_BAND in the present example embodiment. Antenna node 218 is also coupled to a second capacitor C12 which is in series with a fourth switch 208 responsive to TxON. Antenna node 218 is also coupled to one end of an inductor L1 with the other end of the inductor connected to the receiver port 216, which is coupled to ground through a third capacitor C2, and a fifth switch 210 couples the Rx port 216 to ground when TxON is asserted. In a receive mode, the first switch, second switch, fourth switch, and fifth switch are open (the third switch is disconnected in this mode), and antenna port 218 is coupled to receive port through L1 and C2, with the other switch elements contributing only negligible parasitic effects. In this receive mode, L1 and C2 form an L-type impedance matching network which is independent of LOW_BAND 206 switch state since switch 212 is open. In a low band transmit mode, the first through fifth switch are all closed, resulting in the transmit port 214 coupled to antenna 218, with C10 in parallel with C12, and isolated from the receive port 216 by inductor L1 and closed fifth switch 210. High band transmit mode is similarly configured, but with the higher tuning frequency afforded by removing additional first capacitor C10 used in low frequency transmit mode. In this manner, L1(C10+C12) form a parallel LC tank, with C10 as a switchable tuning element to cover a high and low frequency band.

FIG. 3 shows one embodiment of the transmit-receive switch of FIG. 2 with floating substrate CMOS transistors used as switching elements for the first 302, second 304, third 306, and fourth 308, and fifth 310 switch. In an alternative embodiment, biasing resistors may be coupled from the transmit port to RxON and also from the receive port to RxON, where RxON is similarly a signal indicating a receive mode operation in the same manner as TxON indicates a transmit mode operation.

Figure 4:
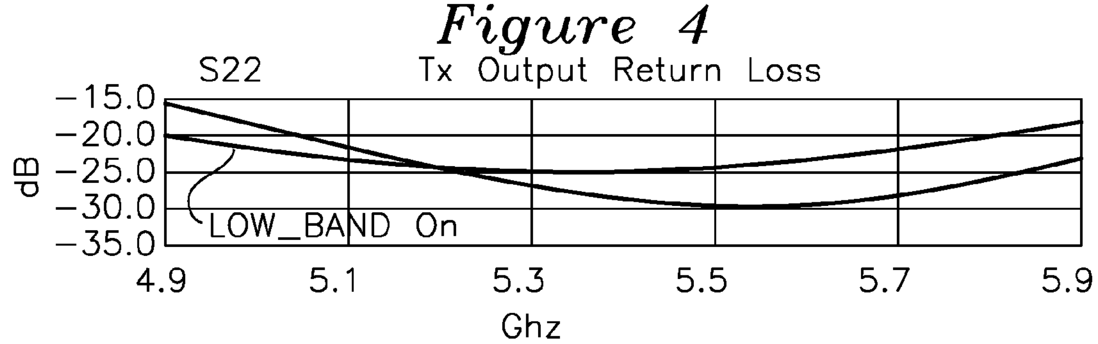
FIGS. 4, 5, 6, and 7 show the transmit frequency response plot for the TR switch of FIG. 3 at 5 Ghz.
Figure 5:
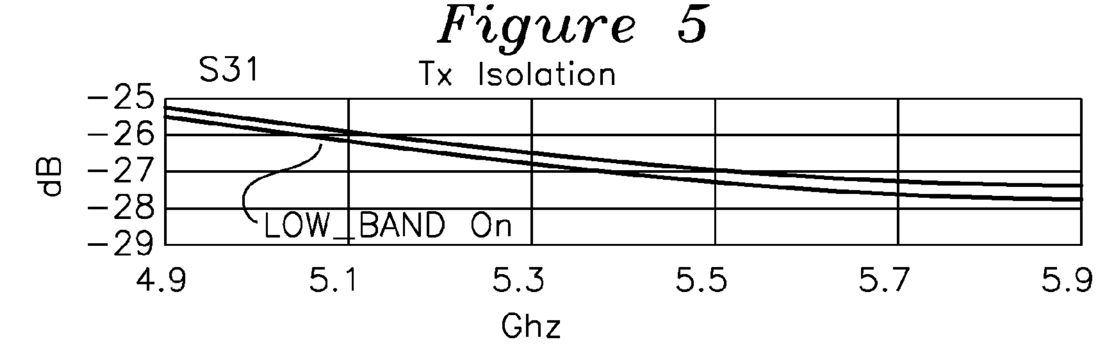
Figure 6:
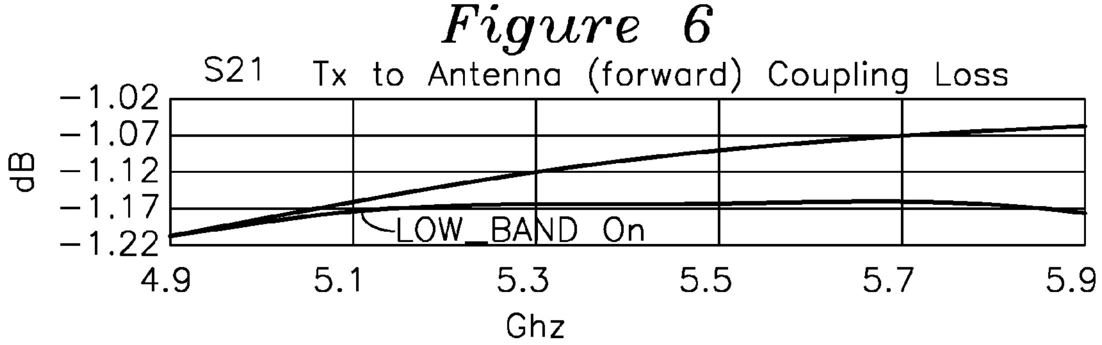
Figure 7:
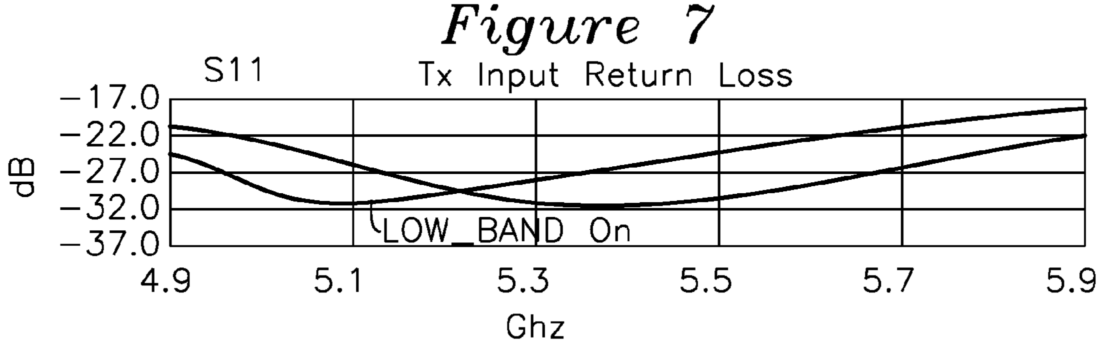

FIGS. 4 through 7 show the 5 Ghz transmit characteristic plots over the frequency range 4.9 Ghz to 5.9 Ghz. FIG. 4 shows the S22 transmit output (antenna port 318) return loss plot for a transmit mode, where S22 return loss is greater than 15 dB over the required frequency range. FIG. 5 shows an S31 transmit isolation plot (transmit port 314 to receive port 316), where S31 is in excess of 25 dB over the required frequency range. FIG. 6 shows the S21 transfer function from transmitter to antenna over the required frequency range, where the S21 forward transfer characteristic has less than 1.12 dB loss above 5.3 Ghz when LOW_BAND is not asserted, and less than 1.22 dB loss below 5.3 Ghz when LOW_BAND is asserted. FIG. 7 shows transmit return loss (reflected power back to PA) as less than −27 dB at frequencies below 5.3 Ghz when LOW_BAND is asserted, as well as above 5.3 Ghz when LOW_BAND is not asserted.

Figure 8:
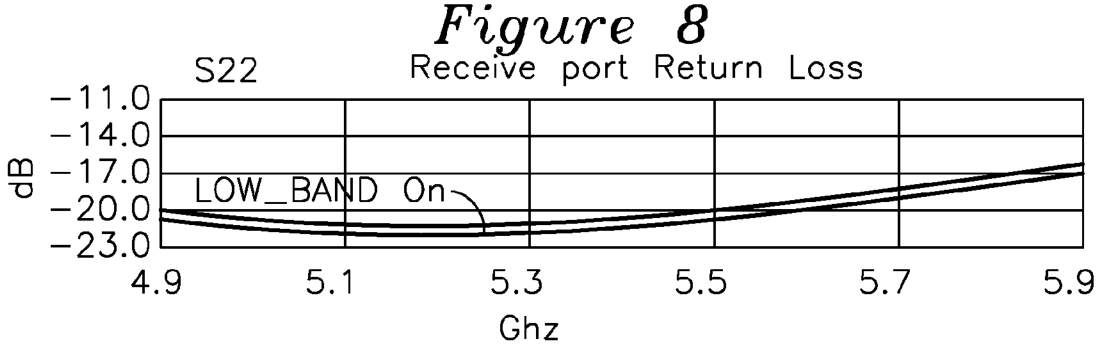
FIGS. 8, 9, 10, and 11 show the receive frequency response plot for the TR switch of FIG. 3 at 5 Ghz.
Figure 9:
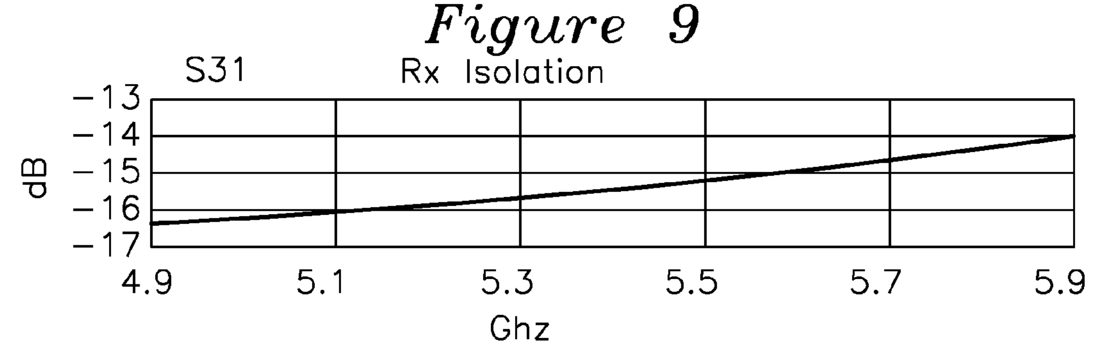
Figure 10:
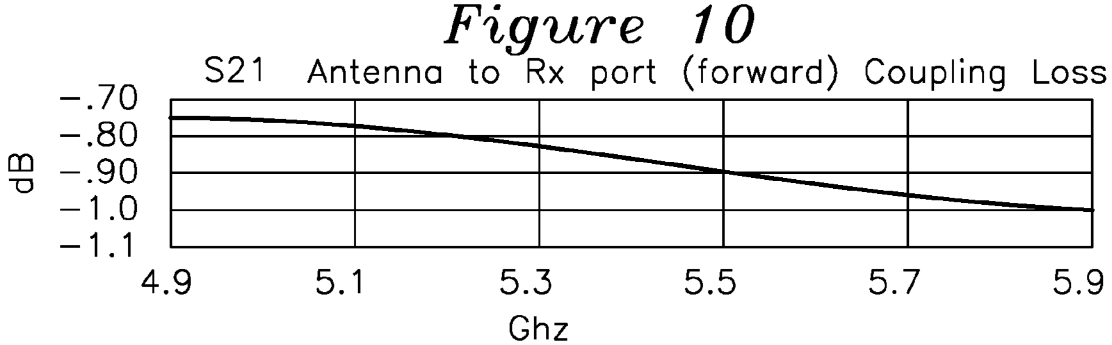
Figure 11:
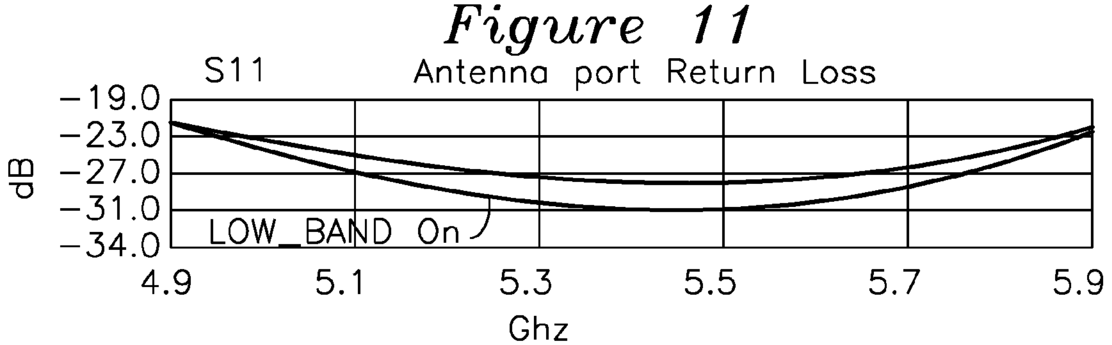

FIGS. 8 through 11 shows the 5 Ghz receive characteristic plots over the same frequency range as was shown for the transmit characteristic. FIG. 8 shows that the receive port return loss regardless of LOW_BAND mode is less than −17 dB. FIG. 9 shows that the Receive port isolation from transmitter port is less than 14 dB over the operating range. FIG. 10 shows the forward loss from antenna port to receiver port is a maximum −1 dB over the operating frequency range. FIG. 11 shows the antenna port return loss is less than 31 dB when LOW_BAND is asserted, and less than 28 dB when LOW_BAND is not asserted.

Figure 12:
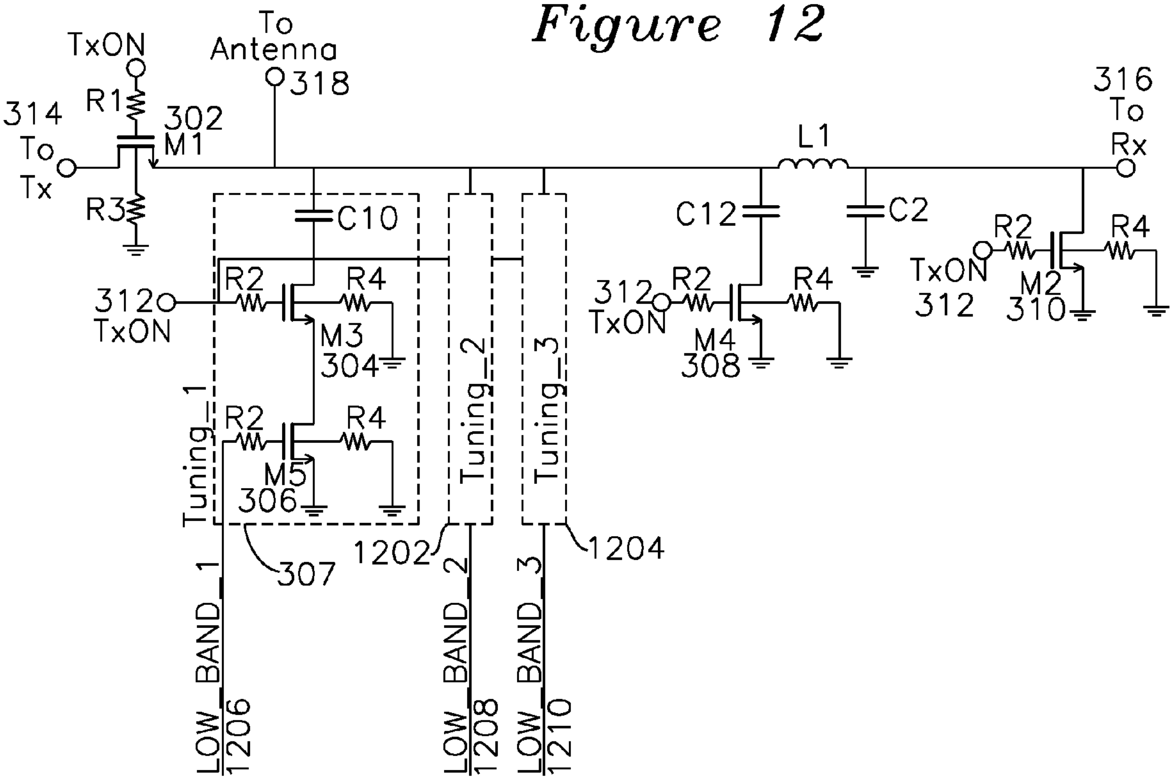
FIG. 12 shows a circuit diagram for a multi-band transmit-receive switch.

FIG. 12 shows an embodiment of the invention where instead of a single tuning structure 307 as described for FIG. 3, two or more tuning structures 1202 and 1204 have a shared TxON input 312, and each tuning structure 307, 1202, 1204 is responsive to a separate LOW_BAND signal 1206, 1208, 1210, respectively. The first capacitor C10 for each tuning structure can be set such that an optimum band of coverage is provided by the plurality of tuning stages operated separately, or in combination with each other.

Figure 13:
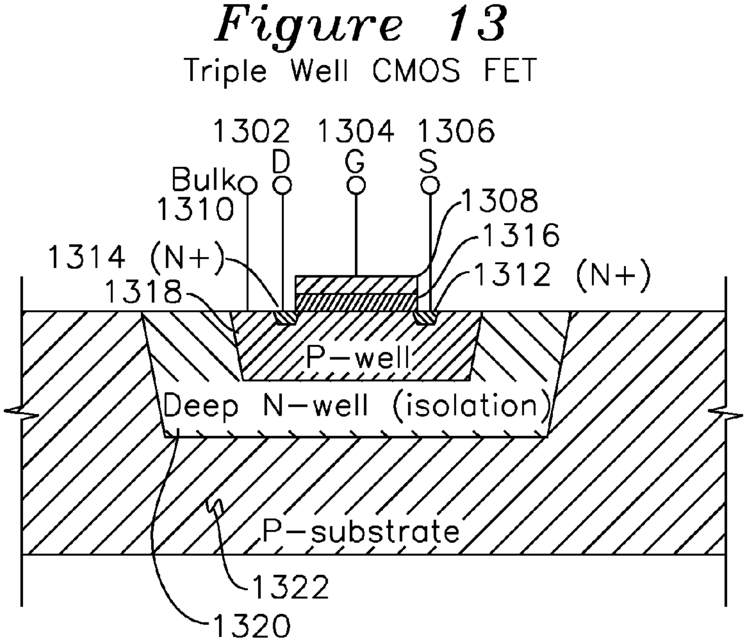
FIG. 13 shows a section view of a triple well CMOS field effect transistor (FET).

FIG. 13 shows one embodiment of a triple well CMOS FET suitable for switch elements in the present invention. Gate 1304 is coupled to a metallized layer 1308 above an insulating layer 1316 which is fabricated over a P-well 1318 which spans an N+ doped well 1312 forming a Source terminal 1306 and an opposite N+ well 1314 forming a Drain terminal 1302.

Isolation of the FET structure is achieved with deep N-well 1320 which is formed in P-substrate 1322, thereby isolating P-well 1318 from the substrate 1322 which is undesirably coupled to other structures. P-well 1318 has a bulk node 1310 which may be connected to a bleed resistor to ground such as R3 shown in FIG. 2.

In one embodiment of the invention, all of the elements of the system (other than antenna 100) of FIG. 1 are on a single CMOS monolithic integrated circuit, including the TR switch 102 as described in the various embodiments, along with LNA 104, PA 112, RF front end components 106 and 108, and baseband processor 110.

The particular modes of the invention are set forth for understanding of the invention only, and it is understood that the invention may be practiced with different devices, at different frequencies, and in other configurations than shown in the present examples. For example, multiple sets of series elements C10, second switch 204 and third switch 206 may be placed on the antenna node 218 to provide for a plurality of different frequency bands, and a variety of different devices may be used as switch elements.

We claim:

1. A transmit-receive switch having:

a transmit port for the application of transmit power;

an antenna port for coupling power to and from an antenna;

a receive port for coupling power from said antenna port;

a TxON signal indicating a transmit interval;

a first switch coupling said transmit port to said antenna when said TxON is asserted;

a first capacitor having one end coupled to said antenna port and the other end coupled through a second switch to ground when said TxON and a LOW_BAND signal are both asserted;

a second capacitor having one end coupled to said antenna port and the other end coupled to ground through a third switch when said TxON is asserted;

an inductor having one end coupled to said antenna port and the other end coupled to said receive port;

a third capacitor coupled from said receive port to ground;

a fourth switch coupled from said receive port to said ground when said TxON is asserted.

2. The transmit-receive switch of claim 1 where said second capacitor, said third capacitor, and said inductor are selected for minimum transmit return loss at a second frequency which is higher than a first frequency.

3. The transmit-receive switch of claim 2 where said first capacitor is selected for a minimum transmit return loss at said first frequency.

4. The transmit-receive switch of claim 1 where at least one of said first switch, said second switch, said third switch, and said fourth switch is a CMOS FET.

5. The transmit-receive switch of claim 4 where at least one said CMOS FET has an isolated substrate, said substrate coupled to ground through an associated resistor.

6. The transmit-receive switch of claim 5 where the value of said resistor is selected to be large enough to isolate signals carried in an associated CMOS FET from said ground and small enough to provide a ground reference for said isolated substrate.

7. The transmit-receive switch of claim 1 where said LOW_ BAND is asserted for transmission at a first frequency range and said LOW_BAND is not asserted for operation at a second frequency range which is above said first frequency range.

8. The transmit-receive switch of claim 1 where said second switch includes one switch responsive to said TxON and in series with another switch responsive to a LOW_BAND signal.

9. The transmit-receive switch of claim 1 where said second switch and said first capacitor is a plurality of series circuits, each selecting separately or in combination a different frequency range.

10. A transmit-receive switch having:

a transmit port having a ground reference;

an antenna port having said ground reference;

a receive port having said ground reference;

a first CMOS FET having a substrate coupled to said ground through a first resistor, said first CMOS FET having a drain coupled to said transmit port and a source coupled to said antenna port;

said antenna port coupled to the series combination of a first capacitor coupled to the drain of a second CMOS FET, the second CMOS FET having a substrate coupled to ground through a second resistor, the second CMOS FET having a source coupled to the drain of a third CMOS FET, the third CMOS FET source coupled to ground and the third CMOS FET having a substrate coupled to ground through a third resistor;

said antenna port also coupled to a second capacitor in series with the drain of a fourth CMOS FET, the source of the fourth CMOS FET coupled to ground and the substrate of the fourth CMOS FET coupled to ground through a fourth resistor, the antenna port also coupled to one end of an inductor with the other end coupled to said receive port;

a third capacitor across said receive port and said ground;

a fifth CMOS FET having a drain coupled to said receive port, said fifth CMOS FET having a grounded source, and a substrate coupled to ground through a fifth resistor;

said first CMOS FET, said second CMOS FET, said fourth CMOS FET, and said fifth CMOS FET having a gate coupled to a TxON signal which is asserted when the transmit port is active and not asserted at other times, said third CMOS FET having a gate coupled to LOW_ BAND which is active when a lower frequency range is in use.

11. The transmit-receive switch of claim 10 where said second capacitor, said third capacitor, and said inductor are selected for minimum transmit return loss at a second frequency which is higher than a first frequency.

12. The transmit-receive switch of claim 11 where said first capacitor is selected for a minimum transmit return loss at said first frequency.

13. The transmit-receive switch of claim 10 where at least one of said first switch, said second switch, said third switch, said fourth switch, and said fifth switch is a CMOS FET.

14. The transmit-receive switch of claim 13 where CMOS FET has an isolated substrate, said substrate coupled to ground through an associated resistor.

15. The transmit-receive switch of claim 14 where the value of said resistor is selected to be large enough to isolate the associated CMOS FET from said ground and small enough to provide a ground reference for said isolated substrate.

16. The transmit-receive switch of claim 10 where said LOW_BAND is asserted for transmission at a first frequency range and said LOW_BAND is not asserted for operation at a second frequency range which is above said first frequency range.

17. The transmit-receive switch of claim 10 where at least one of said first, second, third, fourth, or fifth CMOS FET is a triple well CMOS FET having a bulk node connected to ground with a resistor having a resistance low enough to provide a grounded reference for the bulk node, but has a resistance high enough such that it does not couple significant high frequency currents to ground.

18. A transmit-receive switch having:

a transmit port having a ground reference;

an antenna port having said ground reference;

a receive port having said ground reference;

a first CMOS FET having a substrate coupled to said ground through a first resistor, said first CMOS FET having a drain coupled to said transmit port and a source coupled to said antenna port;

said antenna port coupled to a plurality n of tuning structures, each said tuning structure having a frequency band control input, each said tuning structure comprising:

a series combination of a first capacitor coupled to the drain of a second CMOS FET, the second CMOS FET having a substrate coupled to ground through a second resistor, the second CMOS FET having a source coupled to the drain of a third CMOS FET, the third CMOS FET source coupled to ground and the third CMOS FET having a substrate coupled to ground through a third resistor;

said antenna port also coupled to a second capacitor in series with the drain of a fourth CMOS FET, the source of the fourth CMOS FET coupled to ground and the substrate of the fourth CMOS FET coupled to ground through a fourth resistor, the antenna port also coupled to one end of an inductor with the other end coupled to said receive port;

a third capacitor across said receive port and said ground;

a fifth CMOS FET having a drain coupled to said receive port, said fifth CMOS FET having a grounded source, and a substrate coupled to ground through a fifth resistor;

said first CMOS FET, said second CMOS FET of each said tuning structure, said fourth CMOS FET, and said fifth CMOS FET having a gate coupled to a TxON signal which is asserted when the transmit port is active and not asserted at other times, each said tuning structure third CMOS FET having a gate coupled to one of said frequency band control inputs;

where said frequency band control inputs are used in combination or individually based upon a transmit port frequency band or a receive port frequency band.

* * * * *